United States Patent [19]
Amori

[11] Patent Number: 5,646,823
[45] Date of Patent: Jul. 8, 1997

[54] COMPUTER AND INSTRUMENT ENCLOSURE

[76] Inventor: Michael D. Amori, 10055 W. Carmody La., Lakewood, Colo. 80227

[21] Appl. No.: 413,488

[22] Filed: Mar. 30, 1995

Related U.S. Application Data

[63] Continuation-in-part of Ser. No. 213,546, Mar. 16, 1994, abandoned.

[51] Int. Cl.⁶ .................................................. H05K 7/20
[52] U.S. Cl. .................................................. 361/695
[58] Field of Search .................................. 206/305, 320; 248/316.7, 147, 676, 918; 312/223.2, 223.3, 400, 350; 361/679, 688, 696–697, 715, 724–727; 454/184; 364/708.1; 400/681–683, 691–693; D14/100, 106; G06F 1/16

[56] References Cited

U.S. PATENT DOCUMENTS

| | | | |
|---|---|---|---|
| 4,786,121 | 11/1988 | Lyons | 312/350 |
| 4,949,934 | 8/1990 | Krenz et al. | 248/676 |
| 5,056,331 | 10/1991 | Lotz | 165/80.3 |
| 5,163,870 | 11/1992 | Cooper | 361/695 |
| 5,281,018 | 1/1994 | Cullinan | 312/223.2 |

*Primary Examiner*—Gregory D. Thompson

[57] ABSTRACT

A rigid enclosure for transporting and completely housing electronic equipment from the hazards of physical abuse, liquid spillage and airborne particulate matter, that has a fan that draws filtered coolant air over the electronic components contained within the enclosure and then exhausts the coolant air. Electronic components, including computer equipment, medical devices, testing equipment, and audio components are placed within the enclosure through an access panel which can be opened and closed and locked for security.

16 Claims, 2 Drawing Sheets

COMPUTER AND INSTRUMENT ENCLOSURE

This application is a continuation-in-part of prior application Ser. No. 08/213,546, filed Mar. 16, 1994, now ABN, and claims the benefit, under 35 U.S.C. §120, of such earlier filing date.

BACKGROUND OF THE INVENTION

The present invention relates to protective enclosures in general, and in particular to enclosures for the protection of computer equipment, medical equipment, testing equipment or other electronic equipment.

Typically such electronic devices such as computer equipment, medical equipment, testing equipment or other such electronic devices are fragile and are sensitive to physical abuse or exposure to liquid spillage. Additionally, such devices are sensitive to damaging airborne particles that can land on, or pass through openings in such devices. In order to minimize exposure to physical abuse, liquids and airborne particles, it was common practice to build special rooms to house and protect such devices. However, as such devices became smaller and more portable, it became impractical to always keep them in special rooms. Smaller portable versions of such devices now are commonly found in areas such as shops, portable laboratories, construction sites and so on. Unfortunately, such sites present electronic devices with hazardous exposure to the dangers of physical abuse, liquid spillage and airborne particles.

Prior patents, U.S. Pat. No. 4,600,249 issued Jul. 15, 1986 to T. Anderson, U.S. Pat. No. 5,107,398 issued Nov. 19, 1991 to J. Fallik, U.S. Pat. No. 5,067,040, issued Apr. 21, 1992 to D. Bailey, U.S. Pat. No. 5,163,870, issued Nov. 17, 1992 to Cooper and U.S. Pat. No. 4,786,121, issued Nov. 22, 1988 to Lyons, disclose previous attempts to deal with the problem of protecting electronic devices. Unlike these prior art enclosures, the device of the present invention provides for a six-sided enclosure having a closable access panel that protects the case, controls and input/output units of such components from physical, liquid and airborne particulate damage. The access panel allows for limited access to the protected component without the need for moving the entire enclosure. Access can be limited in the sense that the access panel can be locked, thus preventing unauthorized resetting of controls or unauthorized insertion of transportable media that may have unwanted software stored on it, i.e. floppy discs. The enclosure of the present invention has a ventilation device that draws outside air past a filter, over the electronics that are inside the enclosure to cool the electronics and then exhausts the heated air to the outside of the enclosure. The enclosure of the present invention also functions as a moving case, since the protected device is entirely within the enclosure, which can be picked up or wheeled about with the electronic device safely within the enclosure.

SUMMARY OF THE INVENTION

In summary, the invention is a rigid enclosure for the protection of electronic equipment, comprising: a structural enclosure defining a component receiving cavity, which enclosure comprises upper and lower panels, two opposed side panels and a rearward panel, said panels fixably attached to each other, and an access panel that is movably attached to said enclosure, so as to form said cavity, wherein said access panel can be opened and closed with respect to said enclosure to enable a user thereof to gain access to said receiving cavity, and wherein at least one of said panels defines a ventilation means air passage; at least one of said panels defines a filter means air passage and at least one of said panels defines a connecting wire passage, and said enclosure is capable of transporting a component residing within said cavity; ventilation means comprising means for drawing air from said enclosure cavity through said ventilation means air passage and exhausting such air outside of said enclosure cavity; filter means comprising filter media removably attached to at least one of said panels adjacent said filter means air passage, through which air from outside of said enclosure is drawn by the action of said ventilation means when said access panel is closed; and sealing means comprising suitable sealing media that is fixably installed at said connecting wire passage, said filter means passage and at interfaces between said access panel and all panels juxtaposed said access panel such that when said access panel is closed with respect to said enclosure and said ventilation means is operating, then a substantially sole flow of air from outside of said enclosure is forced through said filter media, into said cavity, and then out from said cavity through said ventilation means air passage.

DESCRIPTION OF THE PREFERRED EMBODIMENTS

Figure 1:
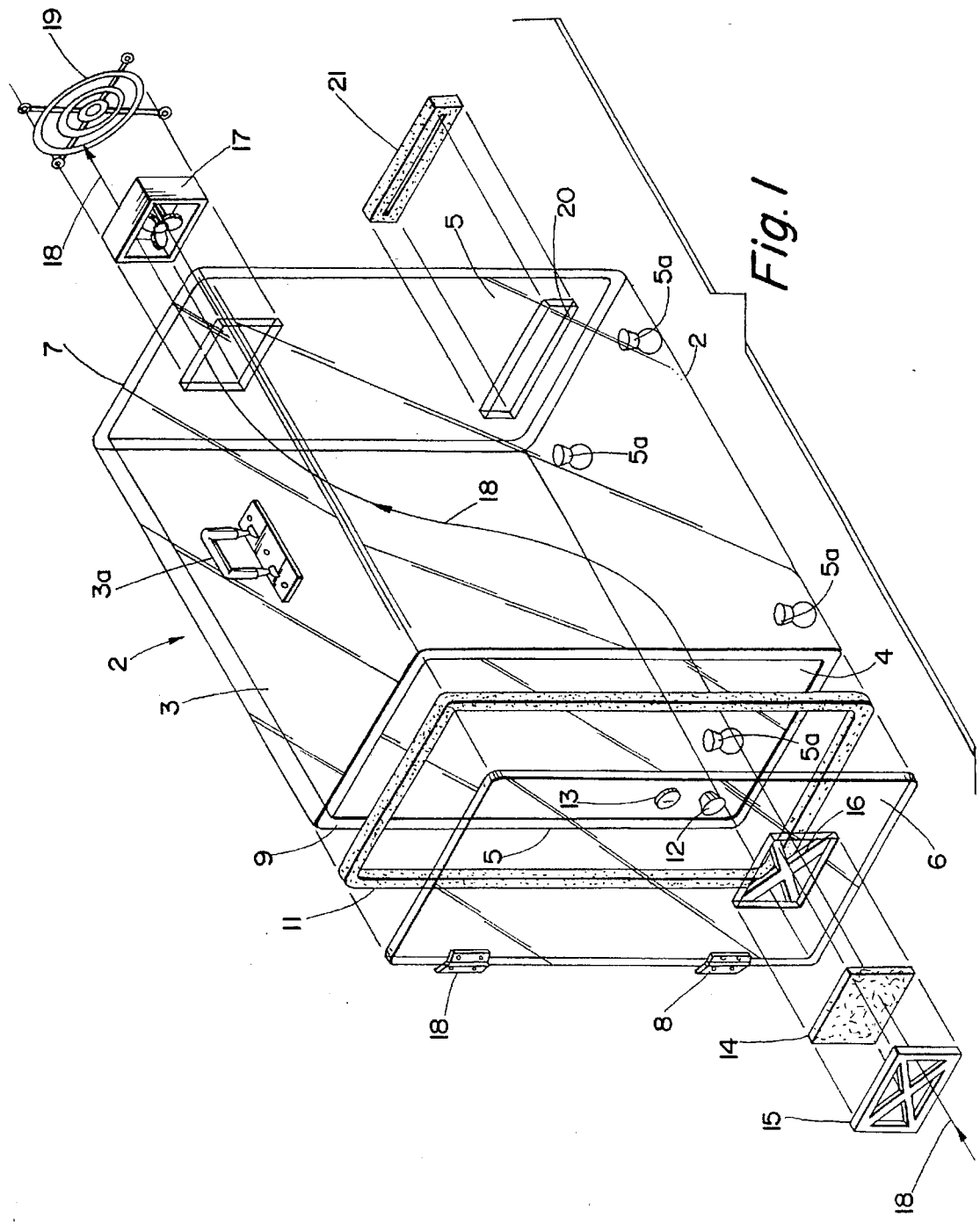
FIG. 1 is an exploded front perspective view, not to scale, of the enclosure of the present invention.
Figure 2:
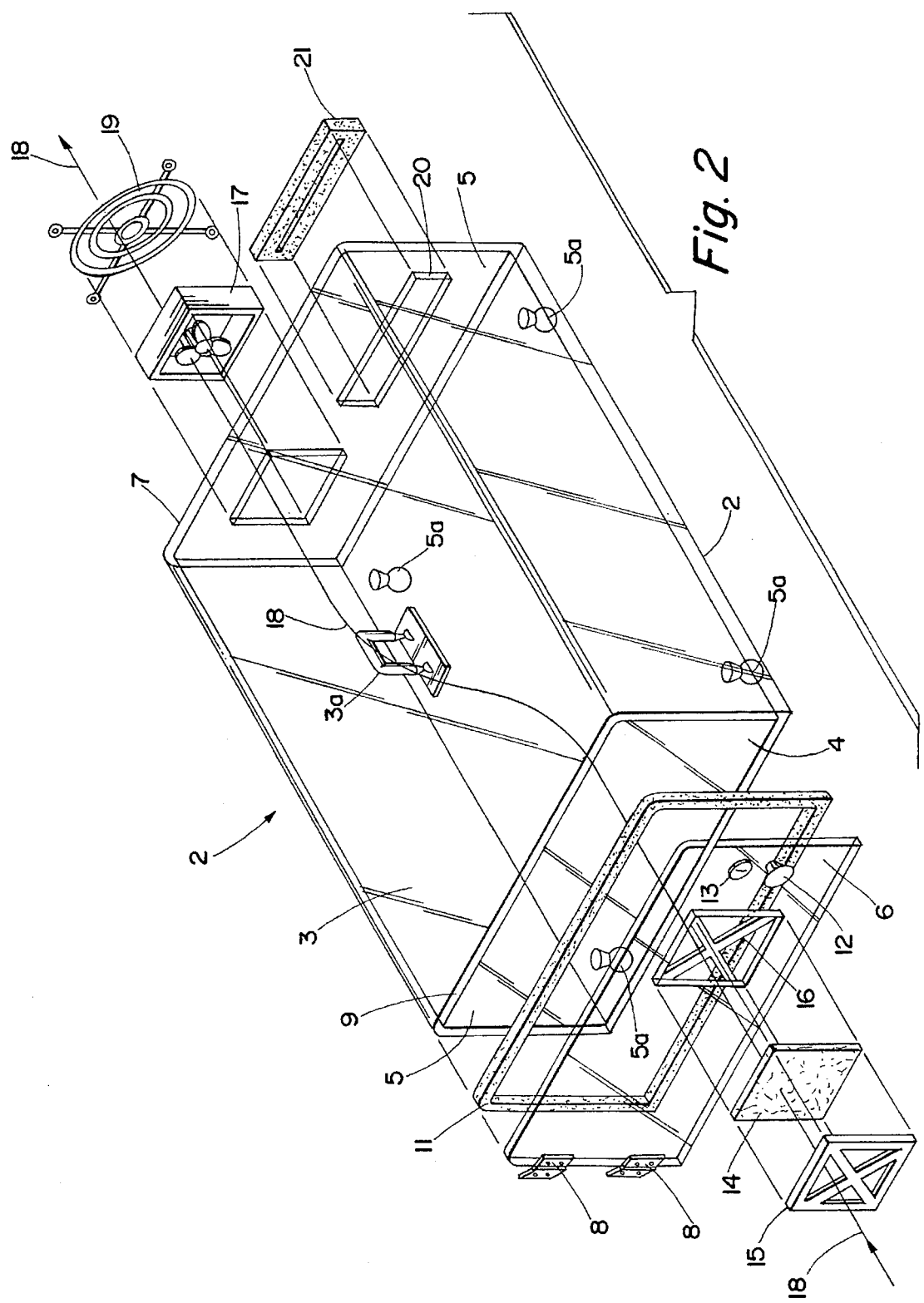
FIG. 2 is an exploded front perspective view, not to scale, of an alternative embodiment of the enclosure of the present invention.

At FIGS. 1 and 2 there are shown generally the rigid protective enclosure 2, in two different configurations. FIG. 1 shows an enclosure that is generally adapted to house and transport electronic components having greater height than width, while FIG. 2 in contrast shows an enclosure that is generally adapted to house and transport electroninc components having greater width than height. In either illustration, the enclosure 2 will enclose one or more electronic devices, such as a computer central processing unit (CPU), medical devices, test devices, audio devices or electronic instruments. The enclosure 2 is fabricated out of five panels or sheets; an upper panel 3, a lower panel 4, two side panels 5, and a rearwards panel 7. The panels are preferably constructed out of a rigid, relatively transparent polymer, such as plexiglass or acrylic plastic, or any other suitable thermoforming or thermosetting plastic. Other suitable materials for the panels include aluminum, steel and vinyl or leather covered plywood. The panels, after being cut to a desired dimension, are preferably joined at their common edges by a suitable plastic adhesive, according to methods and materials well known to those of skill in the plastics fabrication arts. In an alternative embodiment, the top panel 3 and the two side panels 5 are formed by thermoforming a single sheet of polymer and making two perpendicular bends in the sheet, and then adhering the bottom panel 4 and the rearward panel 7. The panels can also be joined at their common edges by heat sealing, ultrasonic welding, or by mechanical means, including nut and bolt combinations, rivets and screws. There is shown on upper panel 3 a handle means 3a for carrying the enclosure and its contents. Handle means 3a is conventionally riveted, screwed or bolted into the upper panel 3. There is also illustrated under lower panel 4 several roller or caster means 5a, which can be any suitable rollers or casters that can bear the weight of the enclosure and its contents and permit easy rolling of the enclosure on floors or other resting surfaces. Such roller or caster means advantageously can be equipped with locking means so that a user can prevent rolling action when that is not desired. If no roller or caster means are attached, the enclosure is advantageously mounted atop a raised base affixed to the bottom of lower panel 4 as additional protection against liquid spills contaminating the contents of the enclosure.

A movable access panel 6 is shown, which can be opened and closed, allowing a user of the enclosure to insert a device or instrument that the user desires to have protected into the interior of enclosure 2, and then close the access panel 6. Although access door 6 can be mounted so as to slide along upper and lower mounts or left and right mounts, the access panel 6 is preferably hinge mounted by hinge means 8, which can be any conventional type of hinge, including knuckle-and-pin hinges or piano hinges, that are mounted onto either side panel, the upper panel or the lower panel. The access panel 6 swings on hinge means 8 to close onto seating flange 9. Seating flange 9 is an inward-oriented flange formed around the periphery formed by the four forward edges of top panel 3, side panels 5 and bottom panel 4. Seating flange 9 has affixed or adhered onto it a gasket sealing means 11. Seating flange 9 can be flush with the edges of panels 3, 4, and 5, as shown, or can be recessed into the interior of the enclosure, if needed to accomodate a particularly thick gasket sealing means. Gasket sealing means 11 is preferably a soft, compressible foam rubber material that compresses when access panel 6 is in its closed position and pressing against gasket means 11. Gasket sealing means 11 can alternatively be a hollow roll of elastomeric material, or felt, or any other material suitable for forming a compressible gasket seal between access door 6 and flange 9. In access door 6 there is mounted a knob or handle means 12 and security lock means 13. Security lock means 13 can be any tumbler-type key operated or combination type lock having an engaging lever to close against an inside surface of flange 9 or a mortise routed into side panel 5 for the purpose of receiving the engaging lever of a lock. The security lock means 13 serves the purpose of limiting access to the component within the enclosure 2 so that controls cannot be reset or data on portable storage media cannot be downloaded into the enclosed component.

In access door 6 a filter media 14 is shown, held in place by filter media holder bracket means 15 and 16. Filter media holder brackets 15 and 16 can be seen to be relatively shallow frame-like brackets having a plurality of support prongs that hold the filter media in place against the panel. Any configuration of bracket is permissable that will securely hold a filter media in place. Brackets 15 and 16 are affixed to the access door panel 6 adjacent an opening in the panel through which air is drawn. Although the opening with the bracket means and filter media is illustrated here as being installed in the access door panel 6, it should be understood that the opening, filter media and holding brackets can be mounted in any of the other panels as well, so long as an adequate air stream can be formed over the contents of the enclosure when the ventilating fan, described below, is turned on. Bracket means 15 and 16 form the framework of a pocket into which filter media 14 is inserted from the top or the side of the framework pocket so formed. The filter media is made of any air particulate filtration media known to the filtration art. Specific selection of a given material will be dictated by a predetermination of what the size limitations will be of airborne particulates that the user wants to eliminate from the interior environment of the enclosure. Air is drawn into the interior of enclosure 2 by ventilating means 17, along direction 18, through filter media 14, which filters out such air. After cooling the contents of the interior of enclosure 2, air is then drawn by ventilating means 17 to be exhausted to the exterior of the enclosure along direction 18. Ventilating means 17 is preferably a motor-driven fan that is securely mounted by any suitable means into rear panel 7 (although it can as well be mounted into any other panel, provided that a suitable flow of cooling air can be achieved). Ventilating means 17 can be a relatively small fan powered by a motor such as a 12 volt, 2,700 rpm Direct Current (DC) motor, readily available from commercial sources, such as the Radio Shack company. A fan of this type will readily move approximately 7 cubic feet per minute (cfm) of air. Most preferably, the motor is connected to a suitable Alternating Current (AC) adaptor, which is in turn plugged into a common household 120 volt outlet. The motor alternately can be battery operated. Ventilating means 17 can run continuously or can be turned on and off by thermostat means that is pre-set by the user to maintain a predetermined temperature range of the air within the enclosure, or by an air flow measuring means that measures the flow of air through the unit, or by a combination of a thermostat means and an air flow measuring means. Any thermostat or air flow measuring meter is suitable for this application, as well known to those of ordinary skill in the measuring device arts. A wire frame guard 19 can be affixed to ventilating means 17 to protect against accidental injury to fingers and hands. Rearward panel 7 defines an opening 20 such that various connection or input and output cables or wires can be run through the rear panel wall and be connected to the device or instrument within the enclosure 2. Such an opening will be generally rectangular, and will have fitted therein a cable sealing gasket 21 of substantially the same length and height as that of the opening 20. Cable sealing gasket 21 is preferably a block of foam rubber or some like elastomeric cellular material that can form a suitable sealing media that is slit through its thickness by a cut that runs substantially the length of the gasket. Because of the slit cut, the foam material of the block remains in constant contact between the upper and lower sides of the slit cut and a cable or cord can be pushed through the foam material of the gasket, which will close around the periphery of the cable or cord, thus forming a seal against allowing airborne particulates entry into the enclosure. At 21 there is shown suitable sealing media that has been sized to fit opening 20, creating an air seal there. A slit cut is illustrated, but it should be noted that the illustrated cut is not to scale and in practice the slit cut will be so thin that it cannot be observed except on very close examination.

The enclosures of the invention can be uniformly sized according to width and length so as to enable them to be modularly stacked one atop another, with no limit to how high they can be stacked, other than the structural strength of the material chosen for their fabrication. In the embodiment in which they can be so stacked, a flange is formed around the periphery of the bottom of the enclosure, of sufficient height to offset the height of the wheels or castors on the bottom. Alternatively, the wheels and casters are not installed, and the units can then be directly stacked one atop the other.

While the invention has been described and illustrated with reference to certain preferred embodiments thereof, those skilled in the art will appreciate that various changes, modifications and substitutions can be made therein without departing from the spirit and scope of the invention. It is especially to be noted that the enclosure will be manufactured in a variety of dimensional sizes in order to accomodate different types of electronic equipment. It is intended, therefore, that the invention be limited only by the scope of the claims which follow, and that such claims be interpreted as broadly as possible.

What is claimed is:

1. A rigid enclosure for the protection of electronic equipment, comprising:

(a) a structural enclosure defining a component receiving cavity, which enclosure comprises upper and lower panels, two opposed side panels and a rearward panel, said panels fixably attached to each other, and an access panel that is movably attached to said enclosure, so as to form said cavity, wherein said access panel can be opened and closed with respect to said enclosure to enable a user thereof to gain access to said receiving cavity, and wherein at least one of said panels defines a ventilation means air passage; at least one of said panels defines a filter means air passage and at least one of said panels defines a connecting wire passage, and said enclosure is capable of transporting a component residing within said cavity;

(b) ventilation means fixably attached adjacent a portion of said panel that defines said ventilation means air passage, comprising means for drawing air from said enclosure cavity through said ventilation means air passage and exhausting such air outside of said enclosure cavity;

(c) filter means comprising filter media removably attached to at least one of said panels adjacent said filter means air passage, through which air from outside of said enclosure is drawn by the action of said ventilation means when said access panel is closed; and (d) sealing means comprising suitable sealing media that is fixably installed at said connecting wire passage and at interfaces between said access panel and all panels juxtaposed said access panel such that when said access panel is closed with respect to said enclosure and said ventilation means is operating, then a substantially sole flow of air from outside of said enclosure is forced through said filter media, into said cavity, and then out from said cavity through said ventilation means air passage.

2. The enclosure as claimed in claim 1, in which said ventilating means is an electric fan.

3. The enclosure as claimed in claim 1, which additionally comprises a guard fixably attached adjacent said ventilating means.

4. The enclosure as claimed in claim 1, wherein said filter means is removably attached onto said at least one panel by inserting the filter media into a filter media holding means, which comprises at least one bracket means fixably attached onto said panel adjacent said filter means air passage, wherein said at least one bracket means is suitably sized to retain and hold said filter media in place.

5. The enclosure as claimed in claim 1, wherein said lower panel rests upon a raised base of predetermined height.

6. The enclosure as claimed in claim 1, wherein said lower panel rests upon a plurality of roller means.

7. The enclosure as claimed in claim 1, further comprising a hand carrying means fixably attached to said upper panel.

8. The enclosure as claimed in claim 1, wherein said connecting wire seal means comprises a block of elastomeric cellular foam material, whose length and height dimensions are substantially the same as those of said connecting wire passage, and which defines a lengthwise slit cut running through a predetermined length of the block.

9. The enclosure as claimed in claim 1, wherein said access panel is hingeably attached to one of the side panels.

10. The enclosure as claimed in claim 1, wherein said access panel is hingeably attached to the upper panel.

11. The enclosure as claimed in claim 1, wherein said access panel is hingeably attached to the lower panel.

12. The enclosure as claimed in claim 1, wherein said access panel has a lock means installed therein that permits said access panel to be locked into a closed position.

13. The enclosure as claimed in claim 1, further comprising a flange extending laterally around an inside perimeter of said side panels, upper panel and lower panel, which flange comes into sealing contact with a portion of an inner surface of said access panel sealing means when said access panel is in a closed position.

14. The enclosure as claimed in claim 13, wherein suitable sealing means is adhered onto said flange so as to improve said sealing contact with said portion of said access panel.

15. The enclosure as claimed in claim 1, wherein a plurality of said enclosures are of uniform width and length, and said plurality of enclosures can be stacked one atop another.

16. A rigid enclosure for the protection of electronic equipment, comprising:

(a) a structural enclosure defining a rectilinear component receiving cavity, which enclosure comprises two side panels, a top panel, a bottom panel, and a rearward panel, said panels fixably attached to each other, and an access panel that is movably attached to said enclosure, so as to form said cavity wherein said access panel can be opened and closed with respect to said enclosure to enable a user thereof to gain access to said receiving cavity, and wherein at least one of said panels defines a ventilation means air passage; at least one of said panels defines a filter means air passage and at least one of said panels defines a connecting wire passage;

(b) ventilation means fixably attached adjacent a portion of said panel that defines said ventilation means air passage, comprising means for drawing air from said enclosure cavity through said ventilation means air passage and exhausting such air outside of said enclosure cavity;

(c) filter means comprising filter media removably attached to at least one of said panels adjacent said filter means air passage, through which air from outside of said enclosure is drawn by the action of said ventilation means when said access panel is closed;

(d) sealing means comprising suitable sealing media that is fixably installed at said connecting wire passage, said filter means passage and at interfaces between said access panel and all panels adjacent said access panel such that when said access panel is closed with respect to said enclosure and said ventilation means is operating, then a substantially sole flow of air from outside of said enclosure is forced through said filter media, into said cavity, and then out from said cavity through said ventilation means air passage.

* * * * *